United States Patent [19]
Adler et al.

[11] Patent Number: 4,463,344
[45] Date of Patent: Jul. 31, 1984

[54] METHOD AND APPARATUS FOR GENERATING A NOISELESS SLIDING BLOCK CODE FOR A (2,7) CHANNEL WITH RATE $\frac{1}{2}$

[75] Inventors: Roy L. Adler, Stanford; Martin Hassner, San Jose, both of Calif.

[73] Assignee: International Business Machines Corporation, Armonk, N.Y.

[21] Appl. No.: 336,478

[22] Filed: Dec. 31, 1981

[51] Int. Cl.³ .......................................... H03K 13/24
[52] U.S. Cl. .............................. 340/347 DD; 360/40
[58] Field of Search .................. 340/347 DD; 360/39, 360/40; 375/19, 76

[56] References Cited
U.S. PATENT DOCUMENTS 3,689,899  9/1972  Franaszek ................... 340/347 DD
4,115,768  9/1978  Eggenberger et al. ..... 340/347 DD
4,146,909  3/1979  Beckenhauer et al. ........... 360/40 X Primary Examiner—T. J. Sloyan
Attorney, Agent, or Firm—Roy R. Schlemmer

[57] ABSTRACT

An algorithm and the hardware embodiment for producing a run length limited code useful in magnetic recording channels are described. The system described produces sequences which have a minimum of 2 zeros and a maximum of 7 zeros between adjacent 1's. The code is generated by a sequential scheme that maps 1 bit of unconstrained into 2 bits of constrained data. The encoder is a finite state machine whose internal state description requires 3 bits. It possesses the attractive feature of reset data blocks which reset it to a fixed state. The decoder requires a lookahead of three future channel symbols (6 bits) and its operation is channel state independent. The error propagation due to a random error is 3 bits. The hardware implementation is extremely simple and can operate at very high data speeds.

5 Claims, 13 Drawing Figures

SEQUENTIAL ( 2,7 ) NOISELESS SLIDING-BLOCK ENCODER/DECODER SYSTEM

FIG. 2 (2,7) ENCODER BLOCK DIAGRAM

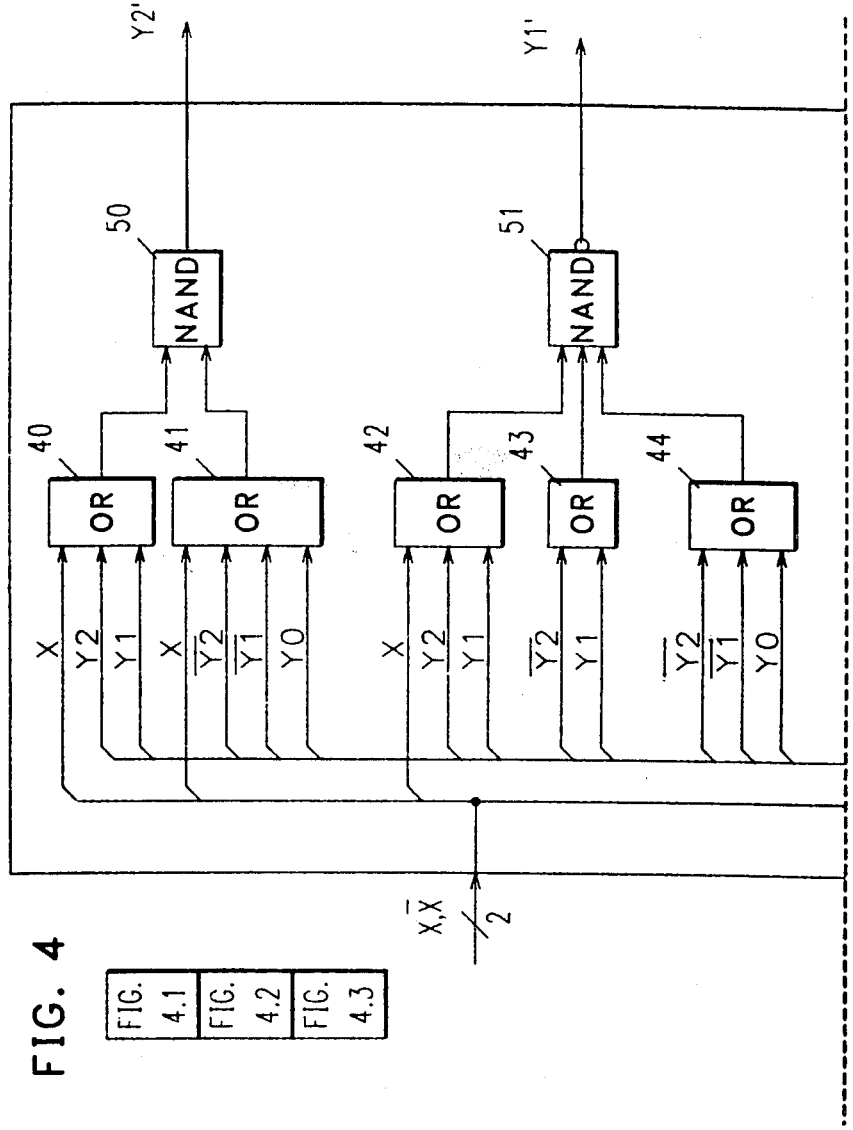

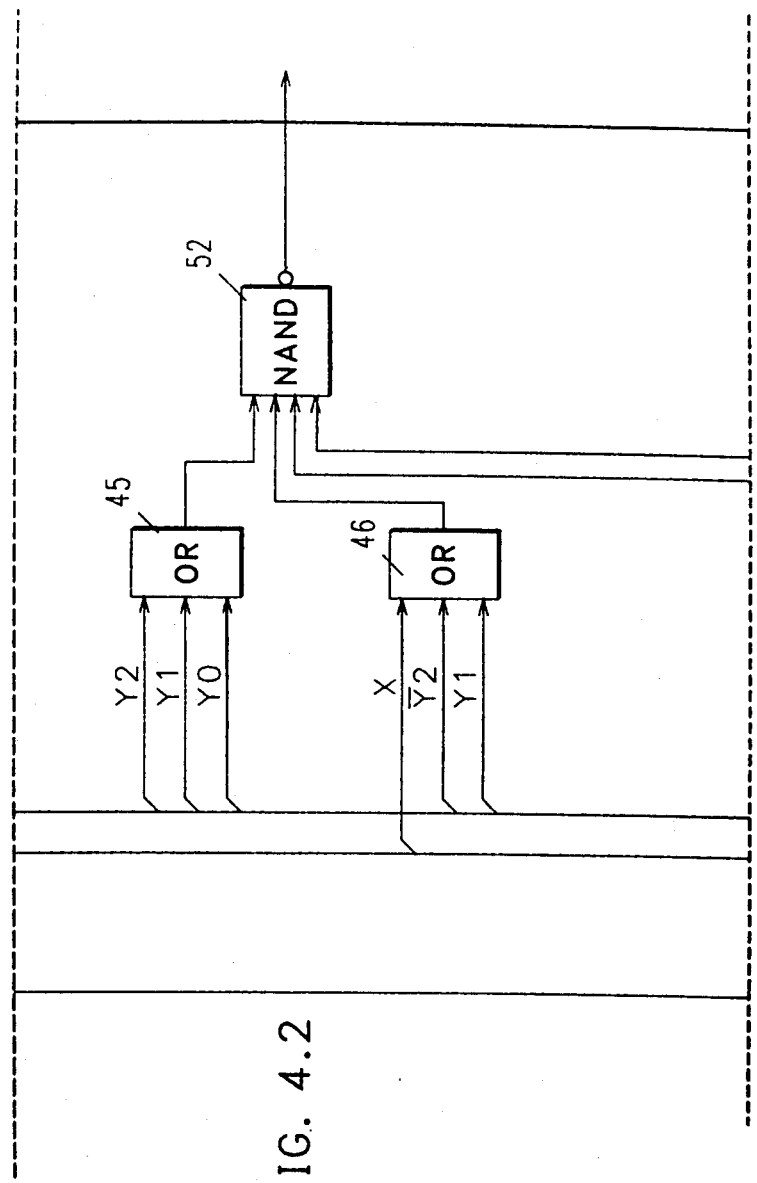
FIG. 4.2

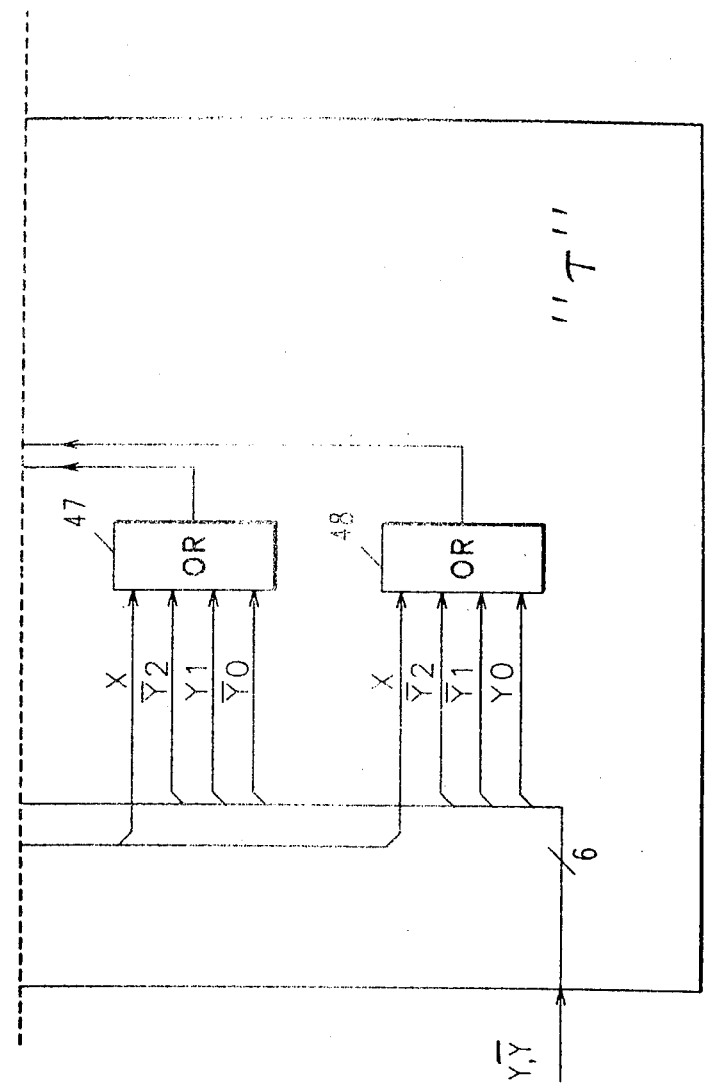
FIG. 4.3

FIG. 5 ENCODER STATE MACHINE FLOW TABLE

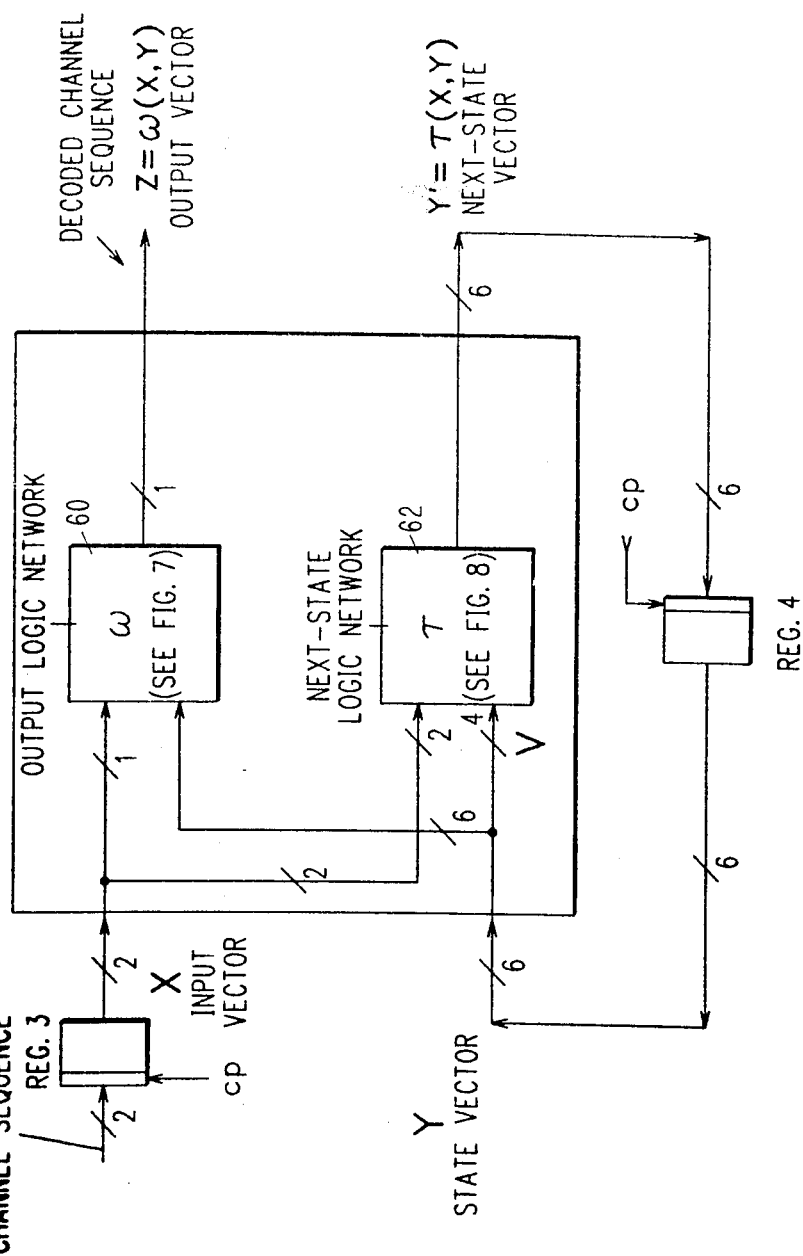
FIG. 6 (2,7) DECODER BLOCK DIAGRAM

FIG. 7.1
OUTPUT LOGIC NETWORK,
(2,7) DECODER

| FIG. 7.1 | FIG. 7.2 |

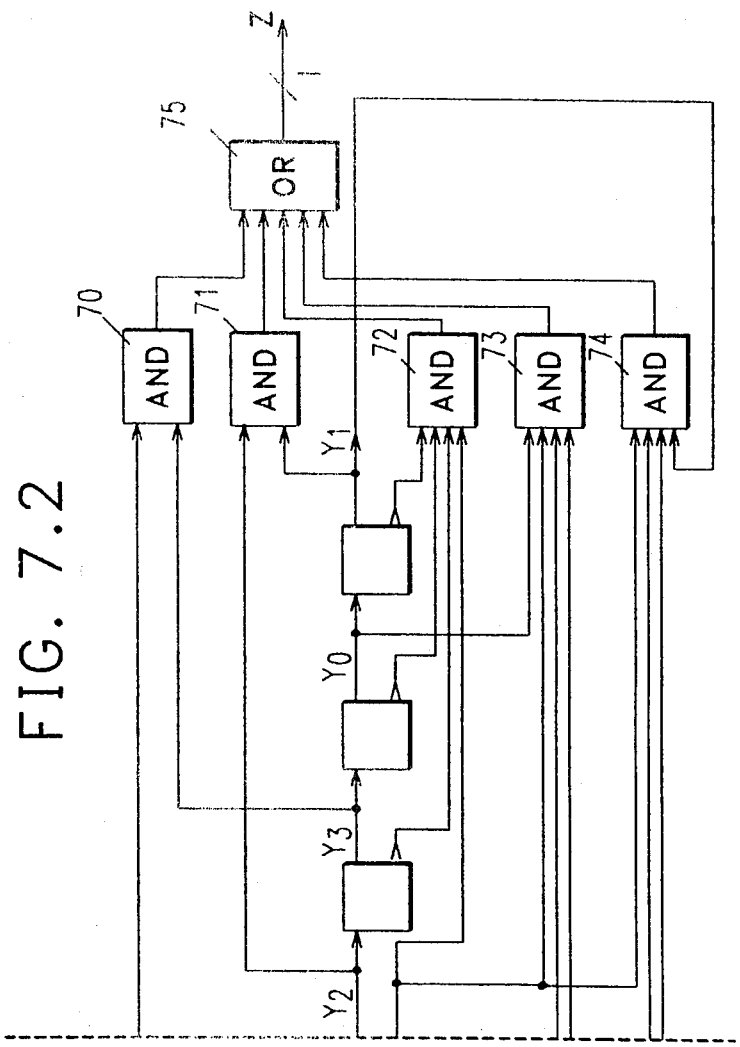
FIG. 7.2

FIG. 8  NEXT-STATE LOGIC NETWORK, (2,7) DECODER
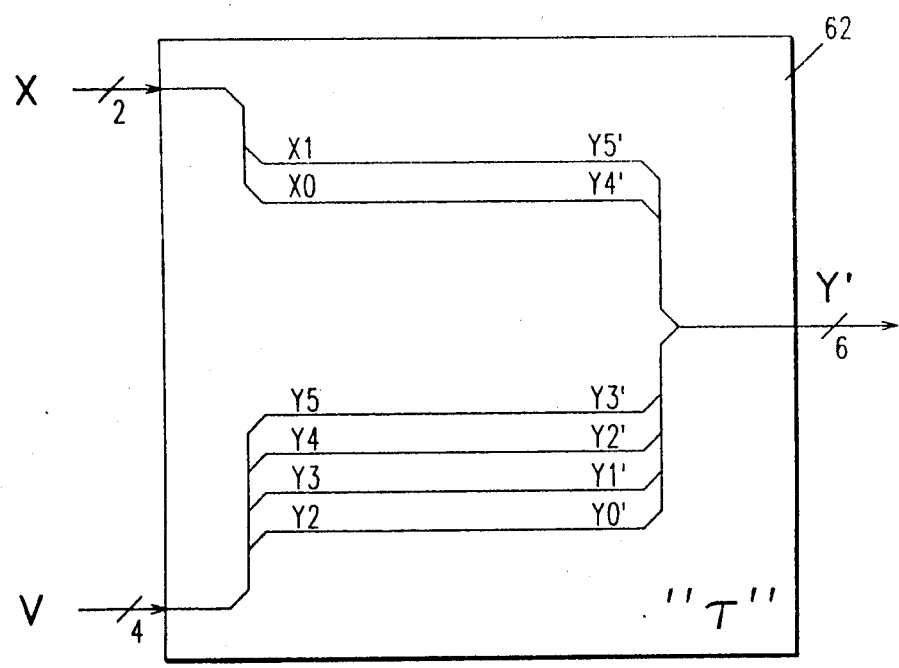
$X = (X1\ X0)$
$V = (Y5\ Y4\ Y3\ Y2)$
$V' = (Y5'.....Y0')\ \tau(X, V) = (X1\ X0\ Y5\ Y4\ Y3\ Y2)$

4,463,344

METHOD AND APPARATUS FOR GENERATING A NOISELESS SLIDING BLOCK CODE FOR A (2,7) CHANNEL WITH RATE ½

BACKGROUND OF THE INVENTION

1. Field of the Invention

This invention describes a sequential coding system which converts unconstrained data into a constrained format in an invertible manner. The described invention is particularly useful in dynamic memory systems.

2. Description of the Prior Art

Various ways have been proposed in the past for increasing the recorded data density on mediums such as magnetic discs or tapes and in other similar media. One approach utilized is known as run-length-limited coding which requires that each "1" in a coded bit sequence must be separated from the nearest adjacent "1" by a specified number of "0's". This number must be at least equal to a minimum quantity d because of intersymbol interference but must not exceed a maximum of k which is required for self-clocking purposes. Codes following this format are generally referred to as (d,k) run-length-limited codes. The present invention relates to a particular code suited for magnetic recording channels wherein d=2 and k=7. To convert unconstrained data into a (d,k)-constrained format generally requires that m unconstrained bits be mapped into n constrained bits, where m<n. The ratio m/n is usually referred to as the coding rate or efficiency. It is obviously desirable to maximize this rate. The tradeoffs usually considered in maximizing the rate are the decoding look-ahead and the hardware complexity.

Raising the coding efficiency or rate at the expense of decoding look-ahead generally results in increasing the error propagation. That is, a single bit error introduced in the code stream will cause a certain number of subsequent bits to also be erroneous before the coding algorithm becomes self-correcting. It is always desirable to minimize error propagation. It has been found that a coding rate of ½ is optimal for the (2,7) code.

U.S. Pat. No. 3,689,899 to P. A. Franaszek discloses two possible (d,k) codes (1,8) and (2,7). The potential data codes are variable length, fixed rate state independent block codes. The coding rate of the (1,8) code is ⅔ and its code dictionary consists of 16 code words whose lengths vary from 3 to 9 bits, in multiples of 3. The (2,7) code has a coding rate of ½ and its dictionary consists of seven words with lengths varying from 4 bits to 8 bits, in multiples of 2.

U.S. Pat. No. 4,146,909 of Beckenhauer et al, discloses a (2,7) RLL code having a ½ coding rate. This patent differs from the present coding system in two major respects. First, it utilizes a table look-up coding system rather than hardware. Second, while maintaining an overall rate ½, it codes variable length unconstrained input vectors into corresponding variable length constrained channel vectors e.g., 1 bit into 2 bits, 2 bits into 4 bits, 3 bits into 6 bits, etc. While the coding methods described in these references will produce codes having the same (d,k) values as the herein disclosed code and the same coding rate ½, the actual coding tables will be substantially different and the coding method differs in a number of respects.

The (2,7) code constructed by Franaszek has a variable length look-ahead encoder and a variable length decoder. The encoder converts one data bit into 2 constrained bits by employing a variable length look-ahead of, at most, two additional data bits. The coded output is thus a function of the present and the future one or two data bits. The decoder maps two constrained bits into one data bit as a function of the present channel state, at most one future channel state and at most two previous channel states. A channel error will not propagate beyond three decoded data bits.

SUMMARY OF THE INVENTION

It is accordingly a primary object of the present invention to provide an improved method and apparatus for producing a d,k (2,7) run-length limited code.

It is a further object of the invention to provide such a code having a coding rate ½ where 1 unconstrained data bit is mapped into two constrained channel bits.

It is another object of the invention to provide such a code wherein error propagation at the decoder does not exceed 3 data bits. Another advantage of this invention is the existence of reset data blocks which reset the finite state machine encoder into known fixed states which are independent of its initial state. This feature is absent in the prior art.

It is another object of the invention to provide a highly efficient encoder/decoder design for producing such a constrained (2,7) run-length limited code.

The objects of the present invention are met by using a novel sequential algorithm (described subsequently) for mapping unconstrained data into a constrained format in an invertible manner. Generally, for a specified set of (d,k) parameters this algorithm specifies finite state machine encoders and decoders that implement such maps.

For the specific set of parameters d=2, k=7, this algorithm specifies a finite state machine encoder whose internal state description requires 3 bits and is denoted by $Y=(Y_2, Y_1, Y_0)$. This encoder is described by two Boolean functions: the next state transition function which maps the input X and the present state $Y=(Y_2, Y_1, Y_0)$ into the next state $Y'=(Y_2', Y_1', Y_0')$, and the output function which maps the input X and the present state $Y=(Y_2, Y_1, Y_0)$ into the output $Z=(Z_1, Z_0)$. The decoder requires a lookahead of three channel symbols, each of which consists of 2 bits. These are denoted by $(Y_3, Y_2)$, $(Y_5, Y_4)$ and by $(X_1, X_0)$. The decoder maps $(Y_1, Y_0)$ into Z as a function of this look-ahead. These are denoted by $(Y_3, Y_2)$, $(Y_5, Y_4)$ and by $(X_1, X_0)$. The decoder maps $(Y_1, Y_0)$ into Z as a function of this look-ahead.

The hardware embodiment of the encoder and decoder as described in FIGS. 3, 4, 7 and 8, is extremely efficient both in terms of the total quantity of logic circuitry required and in terms of the maximum speed that it can achieve.

BRIEF DESCRIPTION OF THE DRAWINGS

FIG. 4 is an organizational diagram for FIGS. 4.1 and 4.3.

FIGS. 4.1–4.3 comprise a logical schematic diagram of the Next-State Logic Network of FIG. 2.

FIG. 5 comprises a state transition table for the (2,7) encoder illustrated in FIG. 2.

FIG. 6 is a functional block diagram similar to FIG. 2 of a finite state decoder suitable for use in the present system.

FIGS. 7.1 and 7.2 comprise a logical schematic diagram of the (2,7) decoder output logic network block shown in FIG. 6 similar to FIG. 3 of the encoder hardware.

FIG. 8 is a logical schematic diagram of the (2,7) decoder next-state logic network similar to FIG. 4 of the encoder hardware.

DESCRIPTION OF THE PREFERRED EMBODIMENT

Figure 1:
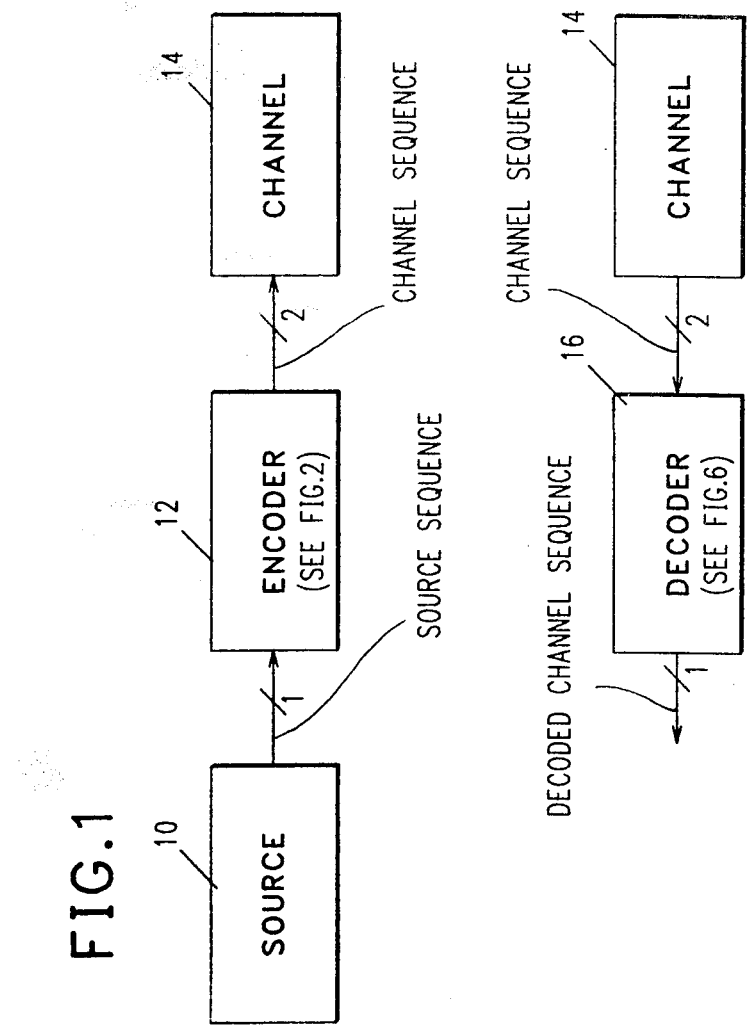
FIG. 1 comprises a functional block diagram of an encoding/decoding system in which the present coding method and apparatus would have utility.

Before presenting a detailed description of the herein disclosed preferred hardware embodiment for realizing the (2,7) run length limited code of the present invention, there will follow a general description of the mathematical basis of the invention.

MATHEMATICAL BASIS FOR THE INVENTION

As stated previously, dynamic memory systems require data codes which impose lower and upper bounds on the runlengths of "0's" that occur between two "1's". A mathematical algorithm is described which permits the design of a finite state machine encoder and decoder for a channel specified by the lower and upper bound parameters d=1 and k=7, respectively. The coding rate is ⅔ where two unconstrained data bits are mapped into 3 constrained channel bits. The error propagation at the decoder does not exceed 5 data bits. Another feature is the provision of reset data blocks. In particular the data block 0100 resets the encoder to a fixed state (state 101 in the binary state representation.

The herein disclosed method involves a mathematically provable algorithm that is used to generate a (2,7) data code as applied to the (2,7)-channel. The algorithm is described in an article by R. L. Adler and B. Marcus, "Topological Entropy and Equivalence of Dynamical Systems", Mem. A.M.S. 219 (1979).

The (2,7) channel is described by a state transition diagram in which the states correspond to the number of zeros following the last occurrence of a 1.

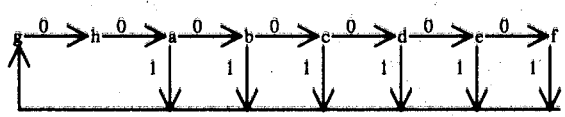

The coding rate is determined by the largest eigenvalue $\lambda_T$ of the state transition matrix T associated with the diagram. The value $\log_2 \lambda_T$ is the channel capacity.

State Transition Matrix T

|   | a | b | c | d | e | f | g | h |
|---|---|---|---|---|---|---|---|---|
| a | 0 | 1 | 0 | 0 | 0 | 0 | 1 | 0 |
| b | 0 | 0 | 1 | 0 | 0 | 0 | 1 | 0 |
| c | 0 | 0 | 0 | 1 | 0 | 0 | 1 | 0 |
| d | 0 | 0 | 0 | 0 | 1 | 0 | 1 | 0 |
| T = e | 0 | 0 | 0 | 0 | 0 | 1 | 1 | 0 |
| f | 0 | 0 | 0 | 0 | 0 | 0 | 1 | 0 |
| g | 0 | 0 | 0 | 0 | 0 | 0 | 0 | 1 |

-continued

State Transition Matrix T

|   | a | b | c | d | e | f | g | h |
|---|---|---|---|---|---|---|---|---|
| h | 1 | 0 | 0 | 0 | 0 | 0 | 0 | 0 |

In order to be able to code unconstrained data in a noiseless manner, it is necessary and sufficient that the channel capacity will exceed the entropy of the data source which, for binary unconstrained data is $\log_2 2 = 1$ bps. There exists $\lambda_{T^2} > 2$ and hence, noiseless coding is possible provided we code one unconstrained data bit into two constrained channel bits. The channel hence has to be extended to describe two-block transitions. We use a convenient representation in terms of a successor table in which we tabulate the admissible two-step transitions.

Successor Table

| a→ b, g | → c, g, h |
|---|---|
| b→ c, g | → d, g, h |
| c→ d, g | → e, g, h |
| d→ e, g | → f, g, h |
| e→ f, g | → g, h |
| f→ g | → h |
| g→ h | → a |
| h→ a | → b, g |

The state transition matrix $T^2$ which describes the extended channel is as follows:

State Transition Matrix $T^2$

|   | a | b | c | d | e | f | g | h |
|---|---|---|---|---|---|---|---|---|
| a | 0 | 0 | 1 | 0 | 0 | 0 | 1 | 1 |
| b | 0 | 0 | 0 | 1 | 0 | 0 | 1 | 1 |
| c | 0 | 0 | 0 | 0 | 1 | 0 | 1 | 1 |
| d | 0 | 0 | 0 | 0 | 0 | 1 | 1 | 1 |
| $T^2$ = e | 0 | 0 | 0 | 0 | 0 | 0 | 1 | 1 |
| f | 0 | 0 | 0 | 0 | 0 | 0 | 0 | 1 |
| g | 1 | 0 | 0 | 0 | 0 | 0 | 0 | 0 |
| h | 0 | 1 | 0 | 0 | 0 | 0 | 1 | 0 |

Besides the extended channel state transition matrix $T^2$ the coding algorithm requires a right approximating eigenvector r that satisfies:

$T^2 r > r$

Generally, this vector can be obtained as the solution of an integer programming problem. For the present invention this vector is $r = [4, 4, 3, 3, 1, 1, 2, 3]^t$. The first stage of the coding algorithm consists of splitting the channel states {a, b, c, d, e, f, g, h} according to the components of the vector r in the appropriate order as shown in the following table (⇒ denotes splitting).

Channel State Splitting Table

| a | a1 a2 a3 a4 |
|---|---|
| b | b1 b2 b3 b4 |
| c | c1 c2 c3 |
| d | d1 d2 d3 |
| e | e |
| f | f |
| g | g1 g2 |
| h | h1 h2 h3 |

Splitting the channel states as above allows for the contruction of a new successor table in which every new channel state possesses exactly two successors. The channel two-blocks which correspond to these state transitions in their respective order are also tabulated.

New Successor Table

|   |              |      | 0  | 1  |        |
|---|--------------|------|----|----|--------|
| 1 |              | a1→  | c3 | c2 | 00     |
| 2 |              | a2→  | c1 | h1 | 00, 10 |
| 3 | h1, d1, c1, b3, | a3→ | g1 | g2 | 01     |
| 4 | f, e, d3, c3, b4, | a4→ | h2 | h3 | 10     |
| 5 |              | b1→  | d1 | h1 | 00, 10 |
| 6 |              | b2→  | d3 | d2 | 00     |
| 7 |              | c2→  | e  | h1 | 00, 10 |
| 8 |              | d2→  | f  | h1 | 00, 10 |
| 9 |              | g1→  | a3 | a2 | 00     |
| 10|              | g2→  | a4 | a1 | 00     |
| 11|              | h2→  | b3 | b1 | 00     |
| 12|              | h3→  | b4 | b2 | 00     |

This table has all the information required to design the encoder. For example d2→f encodes a 0 and produces 00 as an output. If the successive numbers on the lefthand column are used to identify the channel states it may be seen that more states can be collapsed. The final state transition and output tables are as follows:

Final State Transition Table

| | Input | |
|---|---|---|
| State | 0 | 1 |
| 1 | 4 | 7 |
| 2 | 3 | 3 |
| 3 | 9 | 10 |
| 4 | 9 | 12 |
| 7 | 4 | 3 |
| 9 | 3 | 2 |
| 10 | 4 | 1 |
| 12 | 4 | 1 |

Output Table

| | Output | |
|---|---|---|
| State | 0 | 1 |
| 1 | 00 | 00 |
| 2 | 00 | 10 |
| 3 | 01 | 01 |
| 4 | 10 | 10 |
| 7 | 00 | 10 |
| 9 | 00 | 00 |
| 10 | 00 | 00 |
| 12 | 00 | 00 |

If the states are renumbered in sequential order from 0 to 7, and the notation 00=0, 01=1, 10=2, used, then the State Transition Table and the Output Table become the table shown in FIG. 5. Since there are 8 distinct states their description requires 3 bits $y=(y_2, y_1, y_0)$. The notation used is described in FIG. 2. From the state transition table in FIG. 5, it is possible to derive reset blocks. These are input blocks that reset the encoder to a fixed state independently of its initial state. An example of a block with this property is 0100 which resets the encoder to state 5. A hardware implementation of the finite state machine encoder is described in FIGS. 3 and 4.

THE DECODER

The decoder construction is based on the following Decoder lookup table. All possible bit patterns for $x_0$, $x_1$, $y_0$, $y_1$, $y_2$, $y_3$, $y_4$, and $y_5$ which would be encountered as a result of the coded 2 bit channel are included in this table.

DECODER TABLE

| Z | $y_1$ | $y_0$ | $y_3$ | $y_2$ | $y_5$ | $y_4$ | $x_1$ | $x_0$ |
|---|---|---|---|---|---|---|---|---|
| 1 | 0 | 0 | 0 | 0 | d | d | d | d |
| 1 | d | d | 1 | d | d | 1 | d | d |
| 1 | d | 1 | d | 0 | d | 0 | d | 0 |
| 1 | 1 | d | d | 0 | d | 0 | d | 0 |
| 1 | 1 | d | d | 1 | d | d | d | d |
| 0 | (all other combinations) | | | | | | | | d = don't care

Having described the underlying mathematical concepts of the present coding approach, there will now follow a detailed description of a preferred embodiment of a hardware realization of the invention.

The sliding block codes described are sequential schemes which employ look ahead at the decoder. These codes differ from the bounded delay codes of P. Franaszek which employ look ahead at the encoder.

Referring now to FIG. 1, there is shown a high level functional block diagram of a typical encoding/decoding system which would describe any system that required the conversion of unconstrained data to a constrained code regardless of the coding formats. The source block 10 represents a source of binary data which supplies 1 bit at a time to the encoder 12. The output of the encoder is a sequence generated by catenations of 2 bit words. The coded sequence is matched to the characteristics of the channel 14. As described previously, it is assumed that the channel in the present embodiment would be a magnetic recording medium such as a magnetic disc, tape, or the like. However, as will be appreciated by those skilled in the art, the channel could also be a transmission medium, etc.

When it is desired to decode the coded data from the channel 14 back into its original format, the encoded (or constrained) data is supplied 2 bits at a time to the decoder 16 which, as will be well understood, performs the reverse function of the encoder to produce a continuous sequence of unconstrained data.

Figure 2:
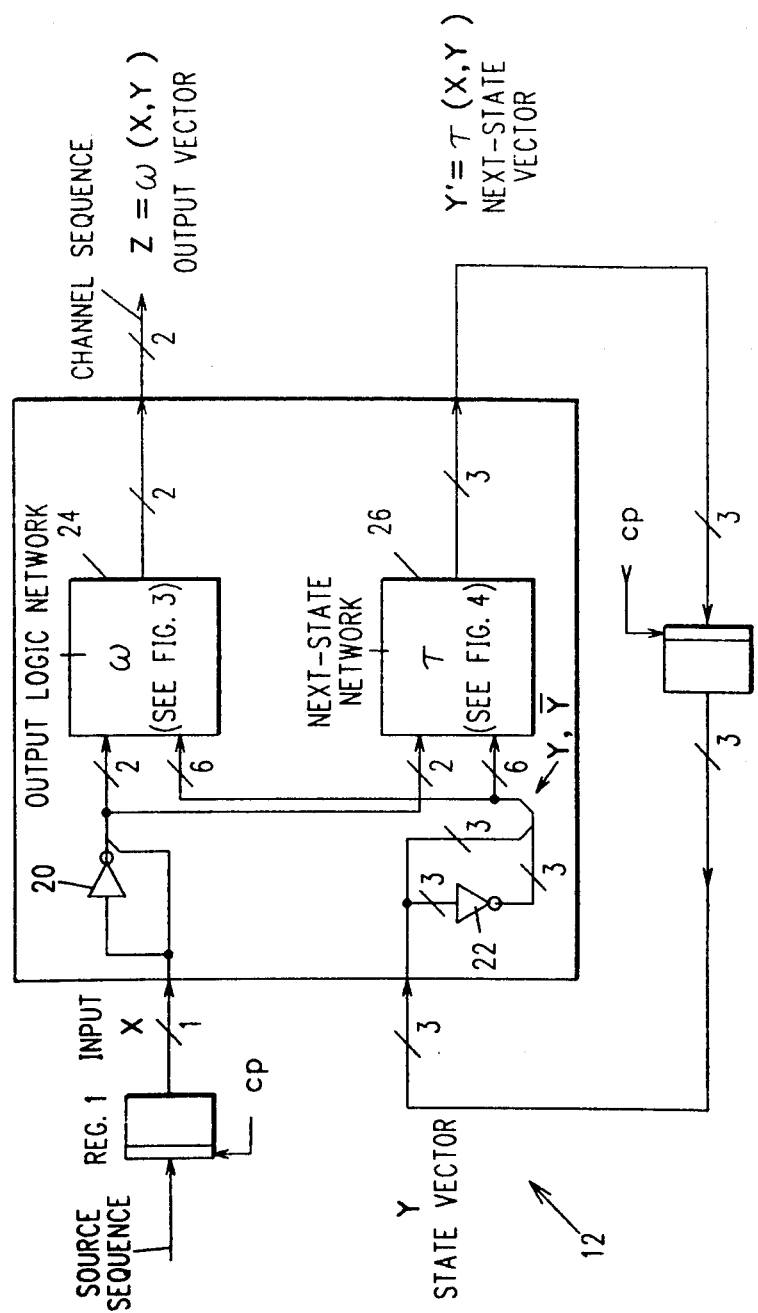
FIG. 2 is a functonal block diagram of a finite state encoder suitable for use in the present invention.
Figure 3:
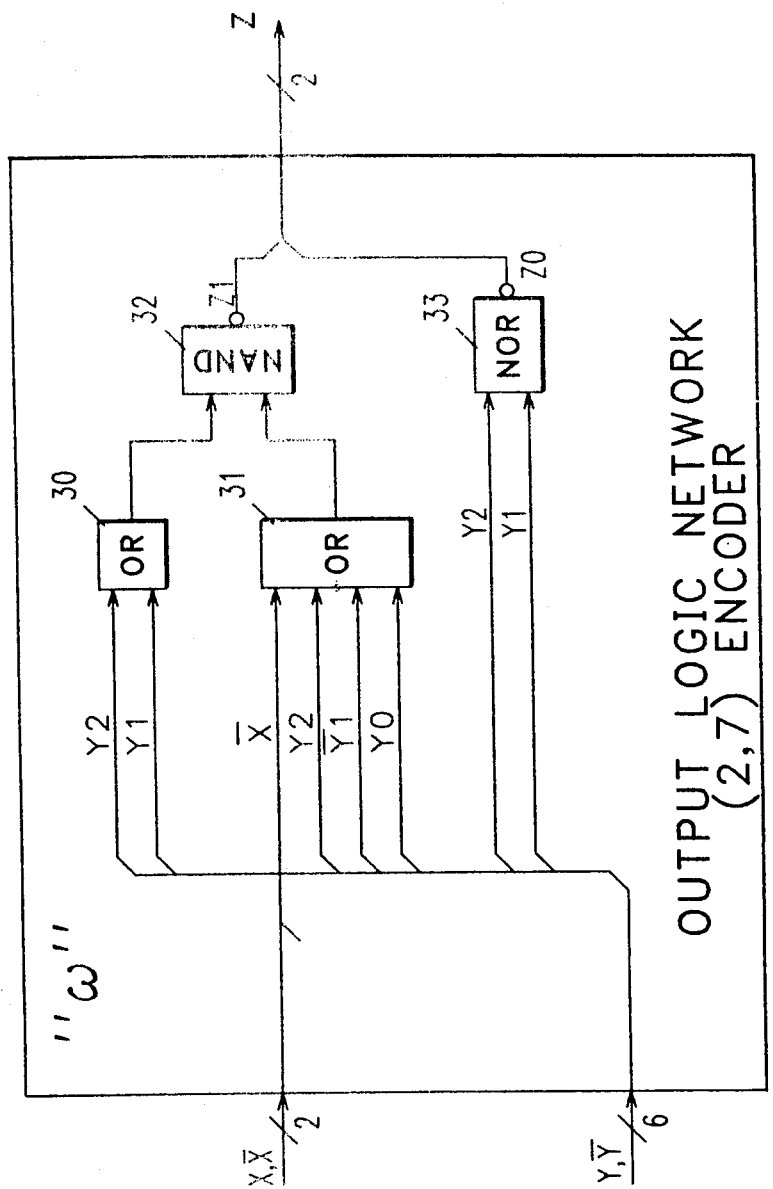
FIG. 3 is a logical schematic diagram of the Output Logic Network block of FIG. 2.

Referring to FIG. 2, a functional block diagram of the present encoder 12 is set forth. The encoder, as is apparent from the drawing, comprises two registers, 1 and 2, two inverters, 20 and 22, and two logic networks, 24 and 26, designated by the symbols ω and Y, respectively. A detailed implementation of the two logic networks, 24 and 26, is shown in FIGS. 3 and 4 respectively. Output logic network 24 produces the 2 bit output vector Z for every new single bit of data X gated into the system.

Next state logic network 26 produces a three bit next-state vector Y' each operating sequence or each time a new source bit X is processed. As will be apparent, the register 2 stores the 3 bit next state vector Y' and this vector is introduced as the state vector Y during the next encoding sequence.

The two inverters, 20 and 22, serve to invert the X vector and the Y vector respectively, to produce a total of 2 bits and 6 bits respectively, which are fed into the two logic networks, 24 and 26, as will be understood by referring to FIGS. 3 and 4. It will be clearly seen from FIG. 2 that both logic networks, 24 and 26, receive a total of 8 input bits, the input vector X and its inverse (2 bits) and the state vector Y and its inverse (6 bits). FIGS. 2, 3 and 4, clearly indicate the designation of the vectors X, Z, Y' and Y as well as their inverses where appropriate.

The individual bits making up the particular data vectors are set forth clearly in all of the drawings, however, they are repeated in the following table for convenience of reference. It will be noted that a capital letter stands for a particular multi-bit data vector and the small letters refer to the individual bits, and it should be noted that since this is a rate ½ code the input vector X comprises only 1 bit; denoted in the drawing by x without any further designation.

| Table of Definitions |
|---|
| X = (Present Input ($X_0$, 1 bit only) |
| Y = ($Y_2Y_1Y_0$) = State Vector |
| Y = ($Y_2'Y_1'Y_0'$) = Next-State Vector |
| = $\tau$(X,Y) |
| Z = ($Z_1Z_0$) = Output Vector = $\omega$(X,Y) |

The data flow within the encoder, as stated previously, is quite evident from FIG. 2, wherein the overall input to the logic network is the source sequence or vector X, comprising a single bit and the state vector Y comprising 3 bits. As will be apparent the next-state vector Y' produced by a current coding sequence becomes the state vector Y for the next succeeding coding sequence. As described previously, these two vectors pass through the respective inverters 20 and 22 to produce the inverse function of the particular vectors which permits the use of somewhat less complicated logic blocks within the actual logic networks, 24 and 26. It will be noted in the legend accompanying FIG. 2, that the output vector Z is a function ($\omega$) of the two vectors X, Y. Similarly, the next-state vector is a different function ($\tau$) of the two vectors X, Y.

The data flow and logic operations performed in the output logic network 24, is clearly shown in FIG. 3. The simplicity of the hardware design is clearly apparent in that there are only two logic levels required, i.e., the two OR circuits 30 and 31, and NOR circuit 33, forming the first level, and a single NAND circuit 32, forming the second level. Thus, this network utilizing as its input the two vectors X and Y, (and their inverses) produces the single 2 bit vector Z, which is the constrained code output for their particular input sequence.

Referring to FIG. 4.1-4.3, the next state logic network 26 of the encoder is shown in a format identical to that of FIG. 3. As will be noted again, only two logic circuit levels are required, the 9 OR circuits 40 through 48, comprising the first level and the three NAND circuits 50 through 52, comprising the second level. All of the inputs to each of the logic circuits are clearly labeled as well as the outputs. The logic network receives as its input, the two vectors X and Y, (and their inverses) and produces a 3 bit output Y' comprising 3 bits which comprise the next-state vector. A total of 16 logic circuits plus the two inverters 20 and 22, are all that is required for the complete logic networks 24 and 26. It is believed that this is a reduction in the amount of circuitry compared with prior art coding schemes which have attempted to use logic circuitry to perform encoding operations for such (2,7) RLL codes. It will, of course, be obvious that such circuitry is faster than encoders and decoders requiring table look-up types of operation for determining code patterns. The operation of all of the circuits of the 2 logic networks of FIGS. 3 and 4 is completely straight-forward wherein the individual outputs are a logical result of the inputs plus the particular logic function involved, i.e., AND, OR, etc.

Referring now to FIG. 5, the encoder state machine flow table for the herein disclosed (2,7) coder having a coding rate ½ as illustrated. This table specifies every possible combination of inputs X and Y which will be encountered by the encoder and similarly, specifies the precise ouputs Z and Y' which will be produced for any given set of inputs. The left hand column defines possible state vector entries Y, and thus all possible configurations of the 3 bit state vector Y which will be encountered. The upper row or column defines the input vector X where it is noted that this vector is evaluated for the actual binary bit content, i.e., 0 and 1, whereas all of the other vectors Y, Y' and Z are shown in decimal form.

It should be noted in the decimal format, whether referring to the 2 bit vector Z or the 3 bit state vector Y, the least significant bit is designated by the legend $y_0$ and $z_0$, respectively. Thus, the designation Y=6 is $y_0=0$, $y_1=1$, $y_2=1$ and similarly, a designation of Z equals 0 specifies $z_0=0$, $z_1=0$ and similarly, the designation Z=1 specifies $z_0=1$, $z_1=0$.

As is apparent from the Legend, the upper diagonal in the body of the table refers to the next-state vector Y' and the lower diagonal refers to the particular 2 bit output vector Z.

The encoder state machine flow table for the present (2,7) code exhaustively specifies all possible data configurations encountered in an input constrained data stream and will produce output code stream of the form d=2, k=7, having a coding rate ½. Thus, this table clearly and unambiguously defines the hardware necessary to produce the required constrained output bit stream Z. The disclosed hardware for the embodiment of FIGS. 2, 3, and 4 is defined by the flow table of FIG. 5 which is, in effect, a truth table of the logical functions performed thereby. The present coder works in exactly the same way regardless of the configuration of the input vector X and the state vector Y. All such permitted vectors are completely evaluated and accounted for in the present hardware.

It should be clearly understood, however, that the particular labels and the order of the X vector and the Y vector (i.e., in ascending order) are for convenience of reference only but the table could be reordered without effecting the actual architecture of the encoder.

Figure 7:
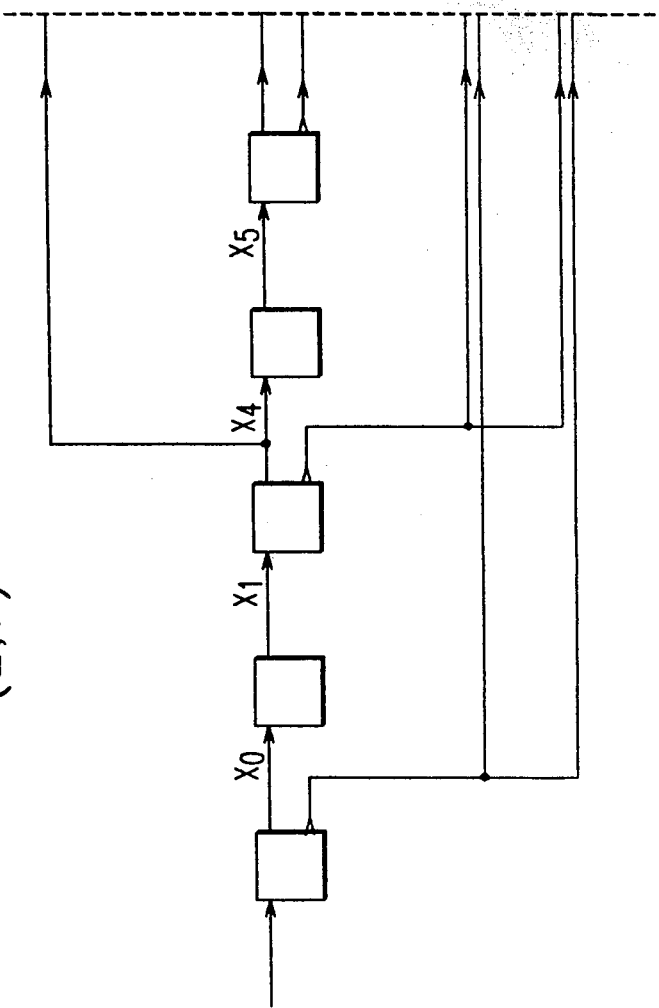
FIG. 7 is an organizational drawing for FIGS. 7.1 and 7.2.

Referring now to FIG. 6, a functional block diagram of the present (2,7) decoder is set forth. It will be noted that this FIG. is quite similar to FIG. 2 of the encoder. As will be noted, two registers, 3 and 4 are utilized for holding the input channel vector X and the next-state vector Y'. Details of the output logic network 60 are shown in FIG. 7. The decoder look-up table is implemented by the logic network in FIG. 7. This network has two logical levels and consists of 5 AND gates and one OR gate.

Referring to FIG. 7.1 and 7.2, the output logic network 60 is shown in logical schematic form. It will be seen that this block receives the catenation of the two vectors as its input. As will be apparent from the drawing, the complete decoding operation is accomplished by the five AND circuits 70 through 74 and a single OR 75. Thus, the output logic network 60 takes the input vector X (2 bits) and the 6 bits of the next-state vector to produce a single output bit Z which represents the decoded unconstrained channel symbol for each two bits of constrained code input.

Referring briefly to FIG. 8, which comprises the next-state logic network 62, it will be noted that the logic in this block merely performs a catenation operation between two new input bits to be decoded $x_1$ and $x_0$ and 4 y bits making up the V vector which are, $y_2$, $y_3$, $y_4$ and $y_5$. These six bits comprise the new next-state vector Y' produced during the immediately preceeding operation, and these outputs are labeled for reference purposes $y_0$ through $y_5$. It will be noted that the next-state vector y', in the decoder, comprises 6 bits as opposed to only 3 bits in the encoder. It will also be noted that the input vector X for the decoder is 2 bits, whereas input vector X for the encoder is only 1 bit. Therefore, to properly evaluate the input for the decoding operation it is necessary to process twice as many bits, to provide all the necessary information for decoding.

INDUSTRIAL APPLICABILITY

The encoder/decoder method and apparatus of the present invention has particular utility in dynamic recording systems, such as magnetic recording channels wherein a particular (2,7) run length limited code provides superior recording results in the magnetic channel as is well known in the art.

As is apparent from the preceding description, the hardware is extremely efficient in that a minimum amount of circuitry is required and, as will be appreciated from the logical schematic diagrams, a minimum number of levels are required in the logic circuitry thus enabling it to operate very rapidly.

The economic advantages to such a system when compared with run length limited encoder/decoder hardware utilized in the prior art are obvious. The 3 bit error propagation inherent in the code is smaller than in previously existing codes, thus rendering the coding method more valuable.

Having thus described my invention, what I claim as new, and desire to secure by Letters Patent is:

1. A method for encoding a series of unconstrained binary input symbols into a run length limited (2,7) code having a ½ rate which comprises consecutively entering one new input symbol (X) comprising 1 bit into a logical tree coding network and simultaneously entering three state bits (Y) which were produced by the encoder during the immediately preceding encoding operation into the same encoding network and producing two channel outputs bits (Z) obeying said (2,7) encoding rules and three next state bits (Y') for use in the next succeeding coding operation, said method further including mapping the single input bit X into said two channel bits (Z) and said three next state bits (Y') as a function of the input bit (X) and 3 state bits (Y) according to the following mapping table:

wherein the decimal values in said table are representative of the binary values manipulated by said method and wherein in the multibit binary vectors Y, Y' and Z, bits y2, y2', and z1 are the most significant bits.

2. A method for encoding as set forth in claim 1 including inserting a predetermined data input configuration into the input code stream to force the next state bits (X') to assume a predetermined pattern whereby a predetermined channel code configuration is produced and which is adapted for control use and for initializing the system.

3. An encoder for producing a run length limited (RLL) code for use in a structurally constrained environment, said code having a minimum of 2 and a maximum of seven 0's between adjacent 1's and a coding rate ½, said encoder comprising means for receiving as an input vector for a given encoding operation, one new message bit (X) and a three bit state vector (Y) derived from the immediately preceding encoding operation, logic circuit means for producing a two bit constrained channel vector (Z), obeying said RLL coding rules and a three-bit next-state vector (Y') which becomes the state vector (Y) for use in the next encoding operation wherein the vectors Z and Y' are functions of all four input bits to the encoder logic circuit means, said logic circuit including means for performing a mapping function to map the two input vectors X and Y into the two output vectors Z and Y' according to the mapping function table:

| Y \ X | 0 | | 1 | |
|---|---|---|---|---|
| 0 | 3 | 0 | 4 | 0 |
| 1 | 2 | 0 | 2 | 2 |
| 2 | 5 | 1 | 6 | 1 |
| 3 | 5 | 2 | 6 | 2 |
| 4 | 3 | 0 | 2 | 2 |
| 5 | 2 | 0 | 1 | 0 |
| 6 | 3 | 0 | 0 | 0 |

LEGEND:
X = PRESENT INPUT
Y = (Y2 Y1 Y0) = STATE VECTOR
Y' = (Y2' Y1' Y0') = NEXT-STATE = τ (X, Y)
Z = (Z1 Z0) = OUTPUT VECTOR = ω(X, Y)

wherein the decimal values in said table represent the binary data gated into and produced by said logic circuit means and wherein in the multibit binary vectors Y, Y' and Z, bits y2, y2', and z1 are the most significant bits.

4. An encoding/decoding system for producing a run length limited (RLL) code for use in a structurally constrained environment, said code having a minimum of 2 and a maximum of seven 0's between adjacent 1's and a coding rate ½, said encoder comprising means for receiving as an input vector for a given encoding operation, 1 new message bit (X) and a three bit state vector (Y) derived from the immediately preceding encoding operation, logic circuit means for producing a two bit constrained channel vector (Z) obeying said RLL coding rules and a three bit next-state vector (Y') which becomes the state vector (Y) for use in the next encoding operation and said logic circuit means producing the vectors Z and Y' as functions of all four input bits to the encoder logic circuit means, said decoder comprising means for receiving a two bit input vector (X) for a given decoding operation and a 6 bit state vector Y' which becomes the state vector Y for use in the next decoding operation, said logic circuit means producing the output vector Z as a function of all 6 bits of the state vector (Y) and a single bit of the input vector (X) and for producing the next-state vector Y' as a function of both input vector bits (X) and the 5 highest order bits of the state vector (Y).

5. An encoding/decoding system as set forth in claim 4 wherein said encoder logic circuit includes means for performing a mapping function to map the two input vectors X and Y into the two output vectors Z and Y' according to the mapping function table:

| X\Y | 0 | 1 |
|---|---|---|
| 0 | 3 / 0 | 4 / 0 |
| 1 | 2 / 0 | 2 / 2 |
| 2 | 5 / 1 | 6 / 1 |
| 3 | 5 / 2 | 6 / 2 |
| 4 | 3 / 0 | 2 / 2 |
| 5 | 2 / 0 | 1 / 0 |
| 6 | 3 / 0 | 0 / 0 |

LEGEND: Y' / Z
X = PRESENT INPUT
Y = (Y2 Y1 Y0) = STATE VECTOR
Y' = (Y2' Y1' Y0') = NEXT-STATE = τ (X, Y)
Z = (Z1 Z0) = OUTPUT VECTOR = ω(X, Y)

the decimal values in said table being representative of the binary data gated into and generated by said encoder logic circuit means, and wherein in the multibit vectors Y, Y' and Z, bits y2, y2', and z1 are the most significant bits, and wherein the decoder logic circuit means performs a mapping function to map the two input vectors X and Y into the two output vectors Z and Y' according to the mapping function table:

| Z | y1 | y0 | y3 | y2 | y5 | y4 | x1 | x0 |
|---|---|---|---|---|---|---|---|---|
| 1 | 0 | 0 | 0 | 0 | d | d | d | d |
| 1 | d | d | 1 | d | d | 1 | d | d |
| 1 | d | 1 | d | 0 | d | 0 | d | 0 |
| 1 | 1 | d | d | 0 | d | 0 | d | 0 |
| 1 | 1 | d | d | 1 | d | d | d | d |
| 0 | (all other combinations) | | | | | | | | d = don't care wherein in the multibit vectors X, Y and Y', bits x1, y5, and y5' are the most significant bits.

* * * * *